US008936494B2

(12) United States Patent
Weinmann et al.

(10) Patent No.: US 8,936,494 B2
(45) Date of Patent: Jan. 20, 2015

(54) TELECOMMUNICATION JACK COMPRISING A SECOND COMPENSATING PRINTED CIRCUIT BOARD FOR REDUCING CROSSTALK

(75) Inventors: Christian Weinmann, Alsdorf (DE); Hermanus Franciscus Maria Van Meijl, Someren-Eind (NL); Mathieu Nesme, Sallanches (FR)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 13/983,648

(22) PCT Filed: Jan. 9, 2012

(86) PCT No.: PCT/US2012/020587
§ 371 (c)(1),
(2), (4) Date: Aug. 29, 2013

(87) PCT Pub. No.: WO2012/108966
PCT Pub. Date: Aug. 16, 2012

(65) Prior Publication Data
US 2013/0337687 A1  Dec. 19, 2013

(30) Foreign Application Priority Data
Feb. 10, 2011  (EP) .................................. 11153993

(51) Int. Cl.
*H01R 24/00* (2011.01)
*H01R 13/6461* (2011.01)
(Continued)

(52) U.S. Cl.
CPC ........ *H01R 13/6461* (2013.01); *H01R 13/6466* (2013.01); *H01R 24/64* (2013.01); *H01R 2107/00* (2013.01); *H01R 1/00* (2013.01); *Y10S 439/941* (2013.01)
USPC ........................ 439/676; 439/620.17; 439/941

(58) Field of Classification Search
CPC ............................ H01R 23/025; H01R 23/005
USPC .......... 439/676, 941, 620.01, 620.17, 620.21, 439/620.23
See application file for complete search history.

(56) References Cited

U.S. PATENT DOCUMENTS

| 5,295,869 A | 3/1994 | Siemon |
| 6,116,964 A | 9/2000 | Goodrich |

(Continued)

FOREIGN PATENT DOCUMENTS

| EP | 0 233 397 A1 | 8/1987 |
| EP | 1 311 022 A1 | 5/2003 |

(Continued)

*Primary Examiner* — Hae Moon Hyeon
(74) *Attorney, Agent, or Firm* — Janet A. Kling (57) ABSTRACT

A telecommunications jack (1) is described for making electrical connection to a mating plug (5) such that the electrical signals travel along a signal path through the jack and the plug when connected. The telecommunications jack includes a first supporting printed circuit board (16) holding an array of front contacts (12) that are connectable to telecommunication wires and a second compensating printed circuit board (17) comprising electrical compensation components for reducing crosstalk. The front contacts have a section that is in the signal path and a section that is outside the signal path. At least one electrical compensation component of the second printed circuit board is electrically connected to at least one front contact in the signal path and another electrical compensation component is electrically connected to at least one front contact in the section outside of the signal path.

9 Claims, 7 Drawing Sheets

(51) Int. Cl.
*H01R 13/6466* (2011.01)
*H01R 24/64* (2011.01)
*H01R 107/00* (2006.01)

(56) References Cited

U.S. PATENT DOCUMENTS

| | | | |
|---|---|---|---|
| 6,120,330 A | 9/2000 | Gwiazdowski | |
| 6,364,712 B2 | 4/2002 | Dürr | |
| 6,464,541 B1 | 10/2002 | Hashim | |
| 6,769,937 B1 | 8/2004 | Roberts | |
| 6,773,302 B2 | 8/2004 | Gutierrez | |
| 7,074,092 B1 * | 7/2006 | Green et al. | 439/676 |
| 7,641,521 B2 * | 1/2010 | Pepe et al. | 439/676 |
| 7,658,651 B2 * | 2/2010 | Pepe et al. | 439/676 |
| 7,682,203 B1 * | 3/2010 | Pharney et al. | 439/676 |
| 7,686,650 B2 * | 3/2010 | Belopolsky et al. | 439/620.17 |
| 7,837,513 B2 | 11/2010 | Millette | |
| 7,909,657 B1 * | 3/2011 | Abughazaleh et al. | 439/676 |
| 7,950,926 B2 * | 5/2011 | Hetzer et al. | 439/59 |
| 8,016,621 B2 * | 9/2011 | Bopp et al. | 439/676 |
| 8,052,482 B1 * | 11/2011 | Lin | 439/676 |
| 2002/0132532 A1 | 9/2002 | Henneberger | |
| 2006/0121790 A1 | 6/2006 | Hashim | |
| 2007/0173120 A1 | 7/2007 | Caveney | |
| 2008/0090468 A1 | 4/2008 | Reeves | |
| 2008/0311778 A1 * | 12/2008 | Aekins | 439/344 |
| 2009/0305563 A1 | 12/2009 | Pepe | |
| 2010/0041278 A1 * | 2/2010 | Bopp et al. | 439/676 |
| 2012/0122353 A1 | 5/2012 | Nesme | |
| 2013/0225009 A1 * | 8/2013 | Hashim et al. | 439/676 |

FOREIGN PATENT DOCUMENTS

| | | |
|---|---|---|
| JP | 10-241811 A | 9/1998 |
| WO | 01/80376 | 10/2001 |
| WO | 2005/064755 | 7/2005 |

* cited by examiner

TELECOMMUNICATION JACK COMPRISING A SECOND COMPENSATING PRINTED CIRCUIT BOARD FOR REDUCING CROSSTALK

CROSS REFERENCE TO RELATED APPLICATIONS

This application is a national stage filing under 35 U.S.C. 371 of PCT/US2012/020587, filed Jan. 9, 2012, which claims priority to European Patent Application No. 11153993.8, filed Feb. 10, 2011, the disclosure of which is incorporated by reference in its/their entirety herein.

BACKGROUND OF THE INVENTION

1. Field of the Invention

The invention relates to connectors for use in telecommunications systems and, more especially, to connector sockets (also known as jacks) of the type used for receiving a mating plug that terminates an input cable containing, for example, telephone or computer data lines.

2. Background

One form of connectors that is widely used in the field of telecommunications is the RJ45 type of connectors comprising a modular jack for receiving a compatible modular plug that terminates four twisted wire pairs. These jacks are used both in active telecommunications equipment, for example routers, and passive equipment, for example patch panels. They are designed for making electrical connection with a mating plug.

An RJ45 jack has an array of eight contacts at its front side (called front contacts), conventionally numbered from "1" to "8", for engaging with respective contacts in the mating plug. As is well-known, front contacts "4" and "5" of the jack are conventionally for connection to a first wire pair on the jack side, contacts "1" and "2" are for connection to a second wire pair, contacts "3" and "6" are for connection to a third wire pair, and contacts "7" and "8" are for connection to a fourth wire pair. In other words, in this type of jack, there is conventionally a region in the array of contacts in which adjacent contacts (i.e. contacts "3" to "6") belong alternately to different wire pairs while, in the remainder of the array, each pair of adjacent contacts (i.e. contacts "1", "2", and "7", "8") belongs to one respective wire pair.

It is known that unwanted crosstalk is mainly created by the plug and front contacts of the jack, especially between the inner wire pairs connected to contacts 3 to 6 of the jack. The amount of crosstalk increases with increasing operating frequency and as the number of connectors occupying a particular space is increased. It may even reach a level at which it interferes with, or prevents, the transmission of data.

It has previously been proposed to reduce crosstalk introduced by the mechanical parts of a telecommunications connector by modifying the shape of the front contacts of the jack. This can, however, result in front contacts that have an undesirably complicated shape, or are difficult to assemble and maintain in the required position within the jack, or do not accept and engage consistently with the variety of mating plugs available on the market.

US 2002/0132532 (Henneberger) describes a modular jack of the RJ45 type in which the front contacts have three different geometric configurations, two of the configurations being described as "rearwardly extending" and one of the configurations being described as "forwardly extending". The described configurations are said to assist in reducing crosstalk between the contacts located at position 3 to 6 of the jack. In other configuration, described in U.S. Pat. No. 6,120,330 (Gwiazdowski), the jack contacts are crossed for the purpose of crosstalk compensation.

It has also been proposed to offer a jack of a telecommunications connector with a printed circuit board (PCB) on which the contacts may be mounted and through which they are connected to the incoming wire pairs, and it has previously been proposed to implement crosstalk compensation on this PCB (see, for example, WO 2005/064755 (Panduit Corp.); US 2008/0090468 (Reeves et al); and U.S. Pat. No. 6,464,541 (Hashim et al)).

It is also known to add at least one other circuit board to the jack which electrical contains compensation components. The above mentioned U.S. Pat. No. 6,464,541 (Hashim et al) discloses a jack with a PCB on which the front contacts are mounted and through which they are connected to the incoming wire pairs and a second PCB comprising contact pads for making electrical contact with free ends of the front contacts. Certain values of capacitance are provided on or within the board between selected pairs of contact pads in order to implement compensation coupling in the connector. The contact pads are connected to the front contacts outside of their signal paths.

US 2009/0305563 (Pepe et al) also disclose a jack comprising more than one PCB within its housing. A first PCB is used for mounting the front contacts and for electrically connecting them to incoming wire pairs. This PCB may comprise electrical compensation components. A second PCB, which may also comprise electrical compensation components, is electrically connected to the front contacts at their free end portion that is outside their signal path. A third PCB, which also comprises electrical compensation components, is electrically connected to the contacts at their intermediate portion that is within their signal path.

In the field of telecommunications jacks there is always the need to further reduce crosstalk, especially in a scenario of constantly increasing band widths. There is further a need of providing jacks that may be produced cost effective. Therefore any simplification in the construction of jacks is desirable as well.

SUMMARY

The present invention provides a telecommunications jack for making electrical connection to a mating plug, wherein the jack and the plug may—when connected with each other—exchange electrical signals, the electrical signals travel along a signal path through the jack and the plug, comprising a first supporting printed circuit board (PCB) holding an array of front contacts, connectable to telecommunication wires. The contacts comprise a section that is lying within the signal path and a section that is lying outside the signal path. The telecommunications jack according to the invention further comprises a second compensating PCB comprising electrical compensation components for reducing crosstalk, wherein at least one of the electrical compensation components of the second compensating PCB is electrically connected to at least one of the front contacts in the section that is lying within the signal path and at least another one of the electrical compensation components of the second compensating PCB is electrically connected to at least one of the front contacts in the section that is lying outside of the signal path.

The telecommunications jack according to the invention may be any kind of jack that is able to establish electrical connection to a mating plug and that may transmit electrical signals to the mating plug. Jacks according to the invention may for example be the above mentioned RJ45 type of jacks, RJ11, RJ12 or similar type of jacks. In the field of telecommunications information may be transmitted in the form of electrical signals, e.g. time-varying voltages or currents. Those signals may be transmitted through electrically conductive materials, i.e. a conductor. Within the jack, the electrical signals also travel along electrically conductive conductors, which may be for example contacts, electrically conductive paths on PCBs, wires etc. The paths that the electrical signals travel along in these conductors may be called signal paths.

The telecommunications jack according to the invention comprises a first supporting PCB that holds an array of front contacts.

The telecommunications jack according to the invention further comprises an array of front contacts connectable to telecommunication wires on one side. On the other side the front contacts out of the array are shaped such that they may make electrical connection with contacts of the mating plug. The front contacts of the jack comprise a section that is lying within the signal path and a section that is lying outside the signal path. In other words, the front contacts of the jack are shaped such that a part of them is used to transmit the electrical signal that is exchanged between the jack and the mating plug and another part of them is not used to transmit the electrical signal.

A second PCB is also part of the telecommunications jack. The second PCB comprises electrical compensation components for reducing crosstalk and is therefore called compensating PCB. According to the invention at least one of the electrical compensation components of the second compensating PCB is electrically connected to at least one of the front contacts in the section of the front contacts that is lying within the signal path and at least another one of the electrical compensation components of the second compensating PCB is electrically connected to at least one of the front contacts in the section of the front contacts that is lying outside of the signal path. Compared to prior art solutions of telecommunications jacks having more than one PCB with compensation components that electrically connect to front contacts within or outside a signal path, the jack according to the invention comprises an arrangement of a telecommunications jack that is much more simple and therefore more cost effective than known solutions. That is because all the compensation elements that are directly electrically connected to the front contacts are placed on one PCB. Besides the advantage of having less parts the solution according to the invention further provides the possibility of arranging the compensation elements in a short distance from a contact region, which might be the region where crosstalk signals may be introduced into the contacts.

The electrical compensation components may be capacitors that are formed by copper plates found on the top-side of the PCB and on the bottom-side of the PCB. It is also possible to have other electrical components on the PCB such as for example inductances. The electronic components may also be located inside the PCB, if for example the PCB is a multilayer PCB.

According to one aspect of the invention the telecommunications jack may have front contacts in the array that are of a first type and/or of a second type. Having front contacts within the array that differ in shape from adjacent front contacts may have the advantage of a reduction of crosstalk between wire pairs associated with those front contacts.

According to another aspect of the invention the telecommunications jack may comprise a support region by which the front contact is held in the jack and a contact region positioned to make electrical connection with a respective contact of the mating plug. The first type of front contact may be shaped so that its contact region extends in a first direction. The contact region of the second type of front contact may extend in an opposite direction of the direction of the contact region of the first type of contact.

The second supporting PCB may comprise contact pads for making electrical contact between the PCB and selected front contacts of the array in the jack. Contact pads are a simple and space saving way to establish an electrical connection between a PCB and a contact. Therefore this solution provides cost advantages. It is also possible to establish the electrical connection between the PCB and the front contacts over additional components such as for example spring contacts, compliant pins or even over soldering.

The contact pads may be arranged in different rows on the second compensating PCB, one row comprising contact pads for making electrical connection in the section of the front contacts that is lying within the signal path and another row comprising contact pads for making electrical connection in the section of the front contacts that is lying outside the signal path. Such an arrangement provides the possibility to electrically connect adjacent front contacts of the array with the second compensating PCB without the need of changing the dimensions of the connector. Regulations require a certain distance between the contact pads to guarantee a minimum breakdown voltage.

With a jack having two different types of front contacts this solution may be especially advantageous if for example the front contacts of the first type are electrically connected to the PCB via the contact pads of one row and the front contacts of the second type are electrically connected to the PCB via the contact pads of a second row. Alternatively, the contact pads can be arranged on the second compensating PCB in more than two rows.

The contact pads may always be in electrical connection with the respective front contacts. In such an embodiment, the front contacts of the telecommunications jack may be shaped such that they touch the contact pads of the second compensating PCB irrespective of the fact of whether the mating plug is inserted into the jack or not. It is also possible to design or shape the front contacts such that electrical connection between front contacts and contact pads is only established when the mating plug is inserted into the telecommunications jack. The first alternative has the advantage that the mating interface between the contacts pads and the front contacts are kept free from dirt and/or corrosion since the electrical connection is always established. Another advantage of this alternative is that it is space saving since the contacts do not need to have any space for a movement they would make. Yet another advantage of the first alternative is that it is reliable—even if the dimensions of a mating plug may vary—since the electrical connection is always established.

The electrical compensation components may be located on both of the first supporting PCB and the second compensating PCB. Such a solution provides design flexibility for the telecommunications connector according to the invention. Depending on each application, the electrical compensation components can be disposed on either or both of the PCBs.

BRIEF DESCRIPTION OF THE DRAWINGS

The invention will now be described in more detail with reference to the following Figures exemplifying particular embodiments of the invention.

DETAILED DESCRIPTION OF THE EMBODIMENTS

Herein below various embodiments of the present invention are described and shown in the drawings wherein like elements are provided with the same reference numbers.

Figure 1A:
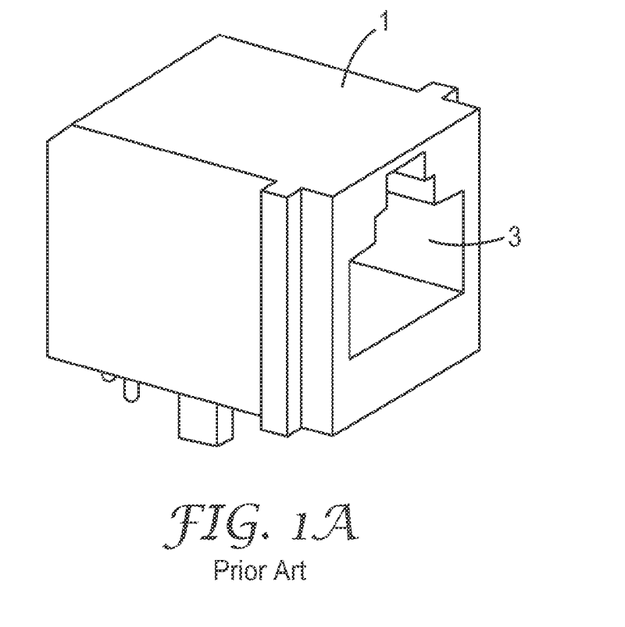
FIGS. 1A and 1B are general perspective views of a telecommunications jack and a plug.
Figure 1B:
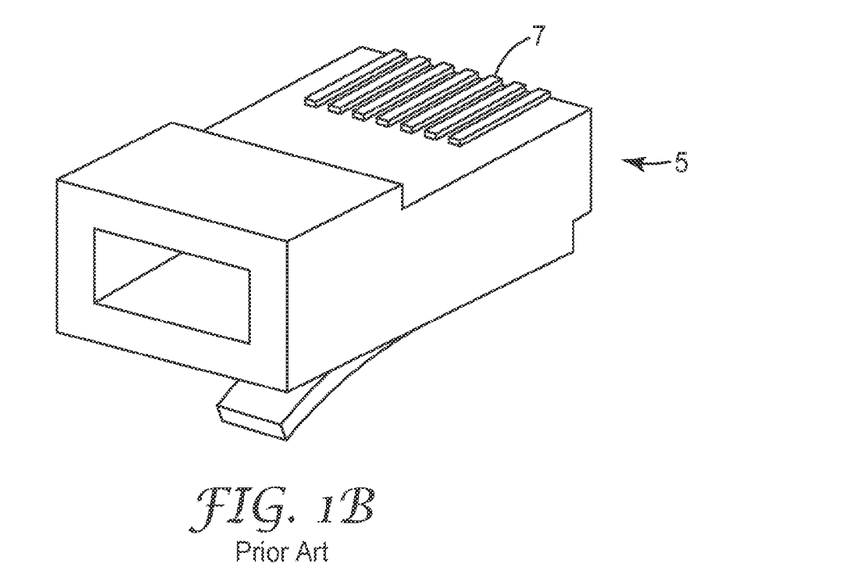

The connector shown in FIGS. 1A and 1B comprises a jack 1 having a front opening 3 for the reception of a mating plug 5. In use, the plug 5 terminates an input cable containing, for example, telephone or computer data lines, and the jack 1 terminates twisted wire pairs to which those telephone/computer data lines are to be connected. The plug 5 has electrical contacts 7 which, when the plug is inserted into the jack 1, engage with front contacts (not visible) within the front opening 3 of the jack.

Figure 2:
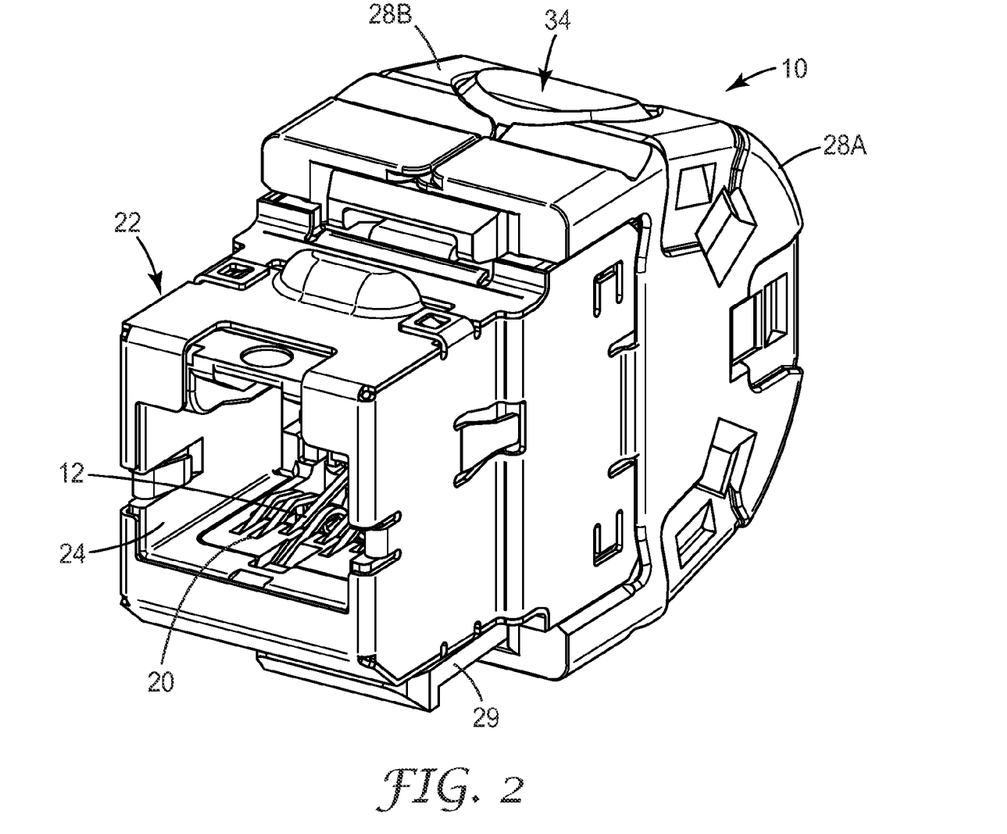
FIG. 2 is a perspective view of an RJ45-type jack.
Figure 3:
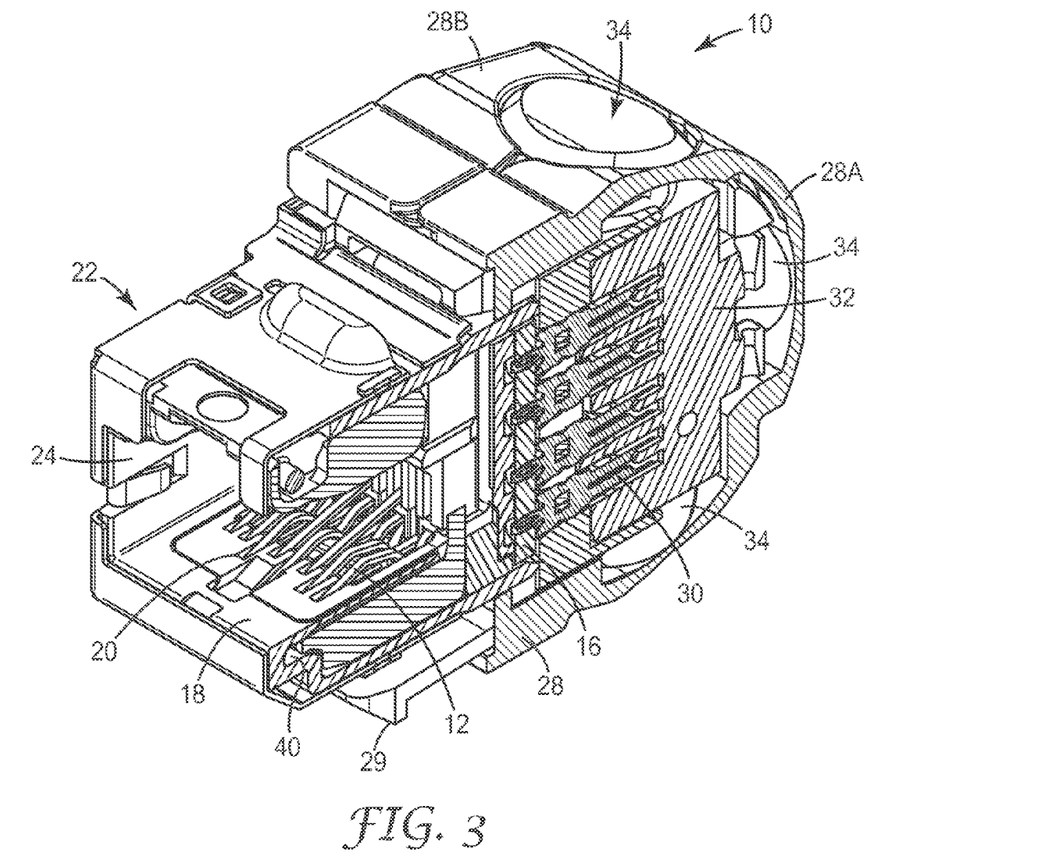
FIG. 3 is a sectional view similar view of the jack, with one side broken away.
Figure 4:
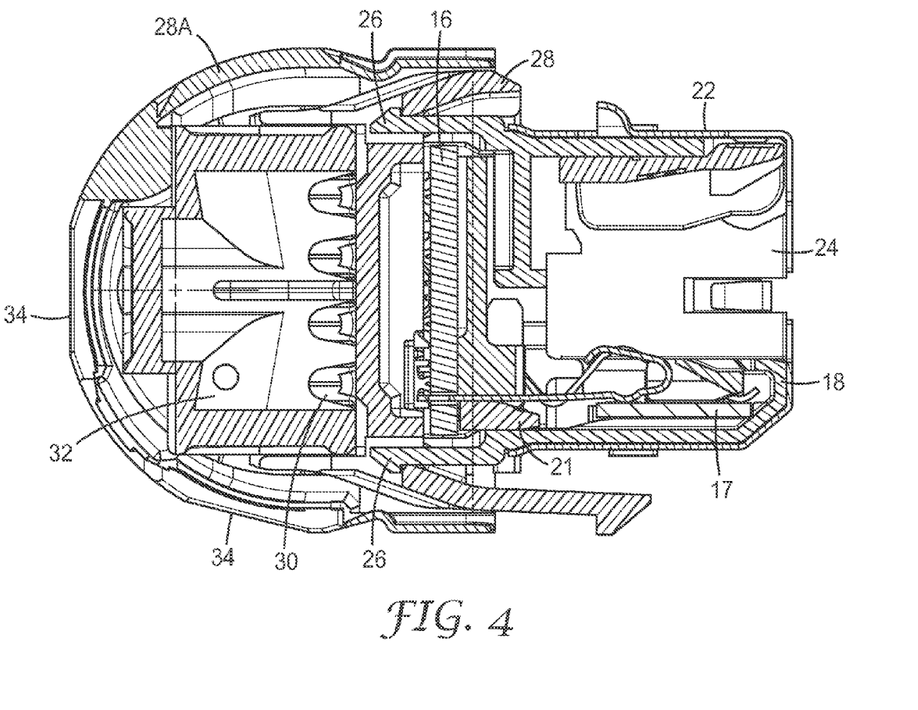
FIG. 4 shows a cross-section of the jack on a central vertical plane.

FIG. 2 shows a jack 10 of the well-known RJ45-type and FIGS. 3 and 4 show the same jack, respectively, with one side removed and in cross-section on a central plane. An RJ45 jack has eight front contacts 12, for connection to four twisted wire pairs in a cable (not shown) incoming to the jack. As described in greater detail below, the front contacts 12 are flexible spring contacts which, when a mating plug is inserted into the jack, resiliently-engage the plug contacts to provide an electrical connection between the two parts of the connector.

Figure 5:
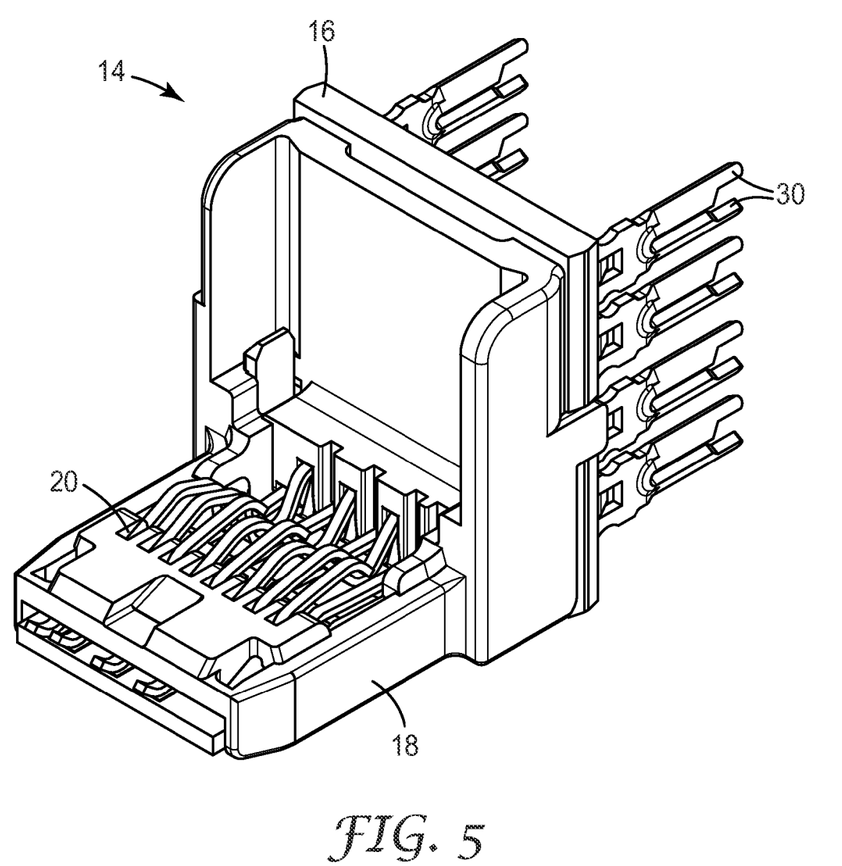
FIG. 5 is a perspective view of the contact support and front contacts of the jack.
Figure 6:
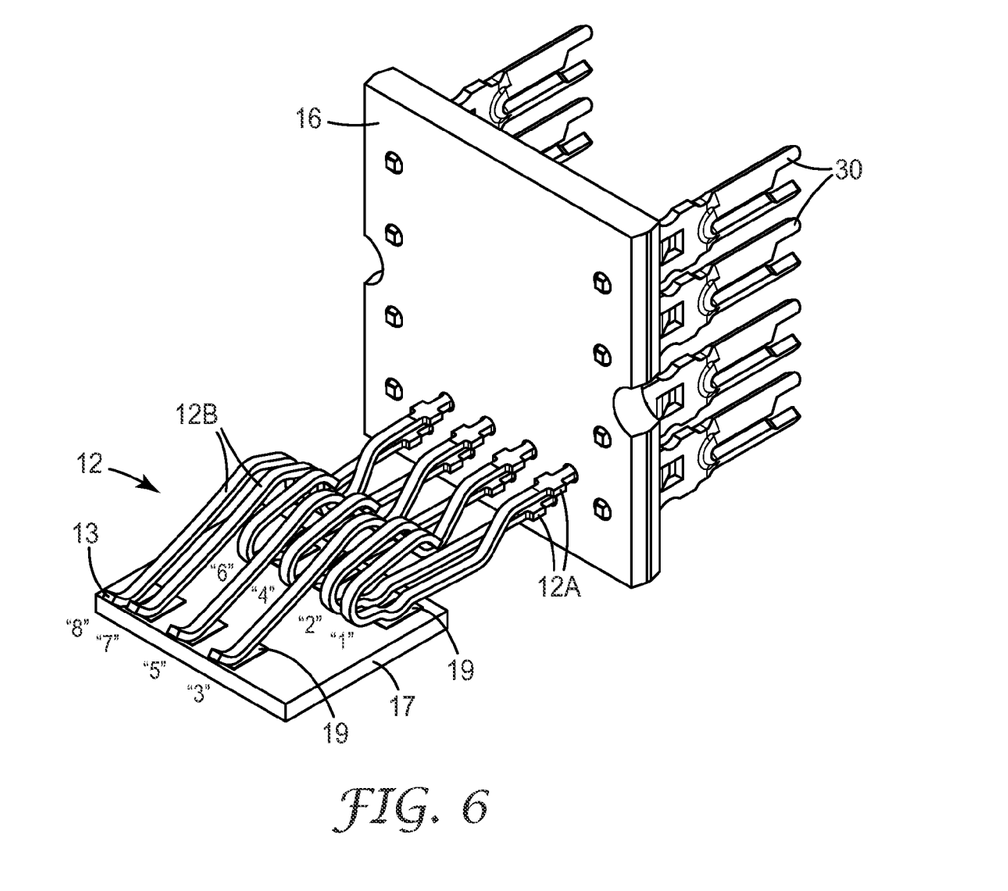
FIG. 6 is similar to FIG. 5, but with part of the contact support removed.

Within the jack 10, the contacts are mounted in a contact support 14 (FIG. 5). The contact support 14 includes a first supporting printed circuit board (PCB) 16, in which one end of each of the front contacts 12 is located as shown in FIG. 6, and a base 18 arranged at 90° relative to the supporting PCB and provided with guide slots 20 in which parts of the front contacts are positioned. The base 18 also carries a second compensating PCB 17 as can be seen in FIGS. 4, 5 and 6. The contact support 14, with the front contacts 12, is contained within a front part 22 of the housing of the jack 10. The front face of the housing part 22 has the above-mentioned opening (here indicated by the reference number 24) for receiving within housing part 22 an RJ45-type plug. The front contacts 12 of the jack 10 are secured in place within the jack by a locking member 21 (FIG. 4) which also provides mechanical support for some of the contacts as they are engaged by a plug inserted into the opening 24, as described in greater detail below.

The front housing part 22 of the jack 10 is provided with latch hooks 26 (visible in FIG. 4) by which it can engage, and be connected into, a rear housing part 28. The rear housing part 28 is provided with outwardly-pivotal flaps 28A, 28B (shown in the closed position in FIGS. 2 to 4) that provide access from the rear to the interior of the jack, and with a forwardly-extending hook 29 for mounting the jack in a required location such as on a patch panel. The rear housing part 28 of the jack 10 contains eight insulation displacement contacts (IDCs) 30 located in appropriately-positioned holes in the PCB 16 as shown most clearly in FIGS. 3 and 6. The rear housing part 28 is engaged by a wire guide 32, inserted into the jack 10 when the flaps 28A, 28B are open, through which wire pairs from an incoming cable (not shown) are directed to the IDCs 30. The wire guide 32 is retained in the jack 10 in close contact with the rear housing part 28, with the incoming wires connected to their respective IDCs, by closing the flaps 28A, 28B which causes the wire guide to move toward the front of the jack and pushing the wires into the IDC contacts. Three access ports 34 in the flaps 28A, 28B provide alternative entries for the incoming cable into the jack 10 to allow the cable to enter the jack from different special directions.

The first supporting PCB 16 carries printed electrical traces (not shown) that connect each of the IDCs 30 to a respective one of the front contacts 12. The front contacts 12 are conventionally numbered "1" to "8" indicated in FIG. 6 and, as is well-known. The contacts "4" and "5" in an inner zone of the array are conventionally connected in the rear housing part 28 to a first wire pair; the contacts "1" and "2" at one side of the array are connected to a second wire pair, the contacts "3" and "6" in the inner zone, on each side of contacts "4" and "5", are connected to a third wire pair; and the contacts "7" and "8" at the other side of the array are connected to a fourth wire pair. It is also well known that, when the jack 10 is in use, unwanted crosstalk can occur between the wire pairs connected to the contacts "1" to "8" (especially the wire pairs connected to the inner contacts "3" to "6"), particularly when the contacts are all similarly-shaped or have comparatively long regions that run parallel to one another, and are closely spaced.

The second compensating PCB 17 also carries printed electric traces (not shown), electrical compensation elements (also not shown) for compensation reasons as well as contact pads 19. The traces may connect the contact pads 19 with the electrical compensation elements. As will be described with reference to FIG. 6 the electrical compensation elements on the second PCB 17 are electrically connected to selected contacts of the front contacts 12 thereby reducing crosstalk. One example for electronic compensation elements are two copper plates that are arranged parallel to each other and with distance from each other in or on the PCB, e.g. one copper plate is arrange on the top surface and the other on the bottom surface of the PCB. Other electronic compensation elements may be inductances that are integrated on or into the PCB. The PCB may be any known kind of PCB.

In the jack shown in FIGS. 2 to 4, the front contacts 12 are shaped to reduce unwanted crosstalk. As best shown in FIG. 6, each of the front contacts 12 comprises a support region 12A adjacent the end of the contact that is mounted in the contact support 14 of the jack 10, and a contact region 12B adjacent the other (free) end 13 of the contact, the contact region 12B comprising at least that part of the contact 12 that is engaged by the respective contact of a mating plug inserted into the jack 10. The support regions 12A of all of the contacts extend perpendicularly from the PCB. Thereafter, the contacts 12 are of either a first type or a second type: contacts "3", "5", "7" and "8" are of the first type, and contacts "1", "2", "4" and "6" are of the second type. The first type of contact is shaped so that its contact region 12B extends generally in the same direction as its support region 12A (i.e. towards the front of the jack 10). The first type of contacts may also be named straight contacts. The second type of contact is shaped so that its contact region 12B extends generally in the opposite direction to its support region 12A (i.e. away from the front of the jack). The second type of contacts may also be named bent back contacts. Within those two types of contact, some variations in shape are possible as described below.

Figure 7:
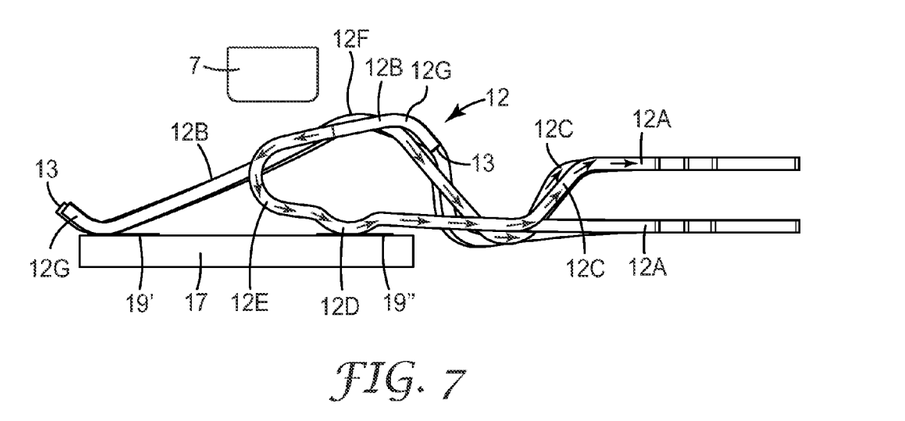
FIG. 7 is a side view of the front contacts of the exemplary telecommunications jack.

It can be seen from the FIGS. 6 and 7 and the above description that the contacts "3" to "6" in the inner zone of the array of front contacts 12 are alternately of the first and second type. It can also be seen that the contact pairs "1", "2" and "7", "8" of the array are respectively of the same type but different from the adjacent contact in the inner zone (i.e. contact "2" is the same as contact "1" but of a different type than contact "3", and contact "7" is the same as contact "8" but is different than contact "6"). It has been found that such an arrangement of the two types of contacts can contribute to a substantial reduction in the crosstalk between all of the wire pairs connected to the jack 10. More particularly, the alternating arrangement of the contacts "3" to "6" in the inner zone of the array contributes to a reduction in the crosstalk between the first and third wire pairs, while the shape of the contacts in the remainder of the array ensures that this reduction is achieved without bringing about to increase in the crosstalk between those pairs ("1", "2" and "7", "8") and the second and fourth pairs.

It will be appreciated that an arrangement of the type shown in FIGS. 6 and 7, but in which the two types of front contacts are interchanged, could also be employed with similar results.

Provided the general arrangement of the two types of front contacts is maintained, the actual shape of the contacts can be varied if required, for example to bring about a further reduction in crosstalk and/or to accommodate physical constraints imposed by the layout of the contacts themselves and/or to impart certain mechanical properties to some of the contacts.

In the particular arrangement shown in FIGS. 6 and 7, the front contacts 12 are arranged in two rows where the support regions 12A of the contacts connect to PCB 16. This configuration specifically enables sufficient distance between the locations of the holes in the PCB 16 into which the support regions of the contacts are inserted. To take account of this, the support regions 12A of the contacts in the upper row (contacts "1", "3", "5", and "7") include a deflection 12C that descends towards a plane of the contacts in the lower row. In the particular arrangement shown, the deflection region 12C may not all have the same shape but this is not significant for the purpose of the present invention. In an alternative aspect the contacts can be arranged in a single row where they contact supporting PCB 16 in which the deflection regions 12C can be omitted.

The plane section of all front contacts 12 of the second type (i.e. contacts "3", "5", "7" and "8") includes a protrusion like bend 12D towards the second compensating PCB 17. The bend 12D is shaped such that the contacts 12 of the second type touch the second PCB 17 at contact pads 19" and are thereby electrically connected with electrical compensation components on the PCB 17. As is well known the bend is shaped such and the radius of the bend is selected such that the front contacts 12 provide a defined contact point with the contact pads 19".

All of the contacts of the second type (contacts "1", "2", "4" and "6") then bend backwards at points 12E, all of which are located at a specific distance from the PCB 16, to form an angle of about 45° between the support region 12A and the contact region 12B of each contact. The contacts of the first type (contacts "3", "5", "7" and "8"), on the other hand, turn generally upwards before bending downwards at points 12F (all located at substantially the same distance from the PCB 16) to form an angle of about 45° in the opposite direction between the support region 12A and the contact region 12B of each contact. In the contact region 12B all of the front contacts 12—first straight type and second bent back type—are arranged in an approximately parallel manner such that all the contacts are lying in one plane.

The free ends 13 of the contacts of the first type (contacts "1", "2", "4" and "6") are shaped such at a point 12G that the contacts 12 touch the second compensating PCB 17 at contact pads 19' and are thereby electrically connected with electrical compensation components on the compensating PCB 17. As is well known the point 12G is shaped such and its radius is selected such that the front contacts 12 provide a defined contact point with the contact pads 19".

The contacts of a plug inserted into the jack 10 will engage the front contacts "3", "5", "7" and "8" at the top of their contact regions 12B (i.e. at the apex of the bend points 12F) and the front contacts "1", "2", "4" and "6" at substantially adjacent locations on their contact regions 12B, exerting a downward force on all of the front contacts (as viewed in the drawings). Both types of front contacts 12 are supported in the support region 12A by the PCB 16 and the locking member 21. The contacts of the first type are also supported by their points 12G that contact the second PCB 17 at contact pads 19'. The contacts of the second type are also supported by their points 12D that contact the second PCB 17 at contact pads 19".

It will be appreciated that the two contact types in the array described above could, if desired, be interchanged.

The shape of the first type of contacts in the array of FIGS. 6 and 7 can provide those contacts with certain advantageous mechanical properties and, in situations in which those mechanical properties are more important to the user than the reduction of crosstalk or if the crosstalk can be reduced in other ways, a jack can be provided in which all of the contacts have that general shape. This could be appropriate, for example when there is less need to increase the density of connectors in a particular location by spacing the front contacts of the jack as closely together as possible and, as a result, crosstalk is less of a problem, or where crosstalk will be compensated in other stages of the connector.

Since the array of the front contacts 12 comprises two types of contacts as described above most of the capacitive crosstalk is generated by the contacts of a plug 5. The additional capacitive coupling has to be as close to the origin as possible. Compensating for crosstalk becomes increasingly difficult, as the distance more between the compensation element and the origin of crosstalk increases. It is therefore advantageous to place a second compensating PCB 17 close to the contact region 12B where the contacts of the mating plug connect with the front contacts of the jack since this is where the crosstalk signals are introduced into the front contacts of the jack. The additional capacitive coupling can for example be introduced by copper-plate capacitors placed on (or in) PCB 17. The PCB can be attached to the contacts 12 via contact pads 19 making an electrical connection to the copper pads on the PCB.

FIG. 7 is a side view of the array of the front contacts 12 together with the second compensating PCB 17 as well as the contacts 7 of the of the mating plug (not shown). In this drawing the support region 12A of the front contacts 12 face the right side of the Figure. As described above the array of front contacts 12 comprises a first type of contacts with a contact region 12B that extends in a first direction (here left side of the Figure) relative to support portion 12 of the same contact and a second type of contacts with a contact region 12B that extend to the opposite direction relative to support portion 12 of the same contact (here right side of the Figure). When the contacts 7 of the mating plug engage with the front contacts 12 of the array of the jack according to the invention and if signals are exchanged between the jack and the mating plug, all of the front contacts comprise sections that lie in the signal path as well as sections that lie outside the signal path.

In FIG. 7 the signal path of the first and the third contact is indicated by little arrows. As can be seen from that drawing very clearly the contact pad 19' that is located close to the free end 13 of the front contacts of the first type engages the front contacts in the region that is lying outside the signal path (no arrows) and the contact pad 19" that is located closer to the support region 12A engages the front contacts of the second type in the region that is lying within the signal path (arrows).

The invention claimed is:

1. A telecommunications jack for making electrical connection to a mating plug, wherein the jack and the plug, when connected with each other, exchange electrical signals, the electrical signals travel along a signal path through the jack and the plug, comprising
   a first supporting printed circuit board holding
   an array of front contacts, connectable to telecommunication wires,
   the front contacts comprising a section that is lying within the signal path and a section that is lying outside the signal path,
   a second compensating printed circuit board comprising electrical compensation components for reducing crosstalk,
   at least one of the electrical compensation components of the second printed circuit board is electrically connected to at least one of the front contacts in the section that is lying within the signal path and
   at least another one of the electrical compensation components of the second printed circuit board is electrically connected to at least one of the front contacts in the section that is lying outside of the signal path.

2. The telecommunications jack according claim 1, wherein the front contacts of the array are of a first type and of a second type.

3. The telecommunications jack according claim 1, wherein each type of front contacts comprises a support region by which the contact is mounted in the connector and a contact region positioned to make electrical connection with a respective contact of the mating plug.

4. The telecommunications jack according to claim 3, wherein the first type of contact is shaped so that the telecommunications jack's contact region extends in a first direction.

5. The telecommunications jack according to claim 3, wherein the contact region of the second type of contact extends in an opposite direction then the contact region of the first type of contact.

6. The telecommunications jack according to claim 1, wherein the second compensating printed circuit board comprises contact pads for making electrical contact between the second compensating printed circuit board and selected front contacts of the jack.

7. The telecommunication jack according to claim 6, wherein the contact pads are arranged in different rows on the second compensating printed circuit board, one row comprising contact pads for making electrical connection in the sections of the contacts that is lying within the signal path and another row comprising contact pads for making electrical connection in the section that is lying outside the signal path.

8. The telecommunication jack according to claim 6, wherein the contact pads are always in electrical connection with the selected contacts.

9. The telecommunications jack according to claim 1, wherein electrical compensation components are located on both of the first supporting and second compensating printed circuit boards.

* * * * *